United States Patent
Jahani et al.

(10) Patent No.: US 6,340,090 B1
(45) Date of Patent: *Jan. 22, 2002

(54) SUBSTRATE FIXTURING DEVICE

(75) Inventors: Hooshang Jahani, Fremont; Scott R. Bruner, San Jose; Peter F. Smith, Los Gatos, all of CA (US)

(73) Assignee: Tooltek Engineering Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/226,194

(22) Filed: Jan. 7, 1999

(51) Int. Cl.[7] ................................................ A47G 19/08
(52) U.S. Cl. .................... 211/41.1; 211/41.18; 206/454; 118/500
(58) Field of Search ........................ 411/41.1, 41.18, 411/40, 59.1; 427/430.1; 118/500; 206/454

(56) References Cited

U.S. PATENT DOCUMENTS

| | | | | |
|---|---|---|---|---|
| D199,504 S | * | 11/1964 | Maiolatesi | D57/1 |
| 3,394,819 A | * | 7/1968 | Saville | 211/126 |
| 3,889,815 A | * | 6/1975 | Merle | 211/41.1 |
| 3,934,733 A | * | 1/1976 | Worden | 206/72 X |
| 3,941,273 A | * | 3/1976 | Dalencon | 211/41.1 |
| 4,088,254 A | * | 5/1978 | Hooper | 118/500 X |
| 4,313,266 A | | 2/1982 | Tam | 34/8 |
| 4,318,749 A | | 3/1982 | Mayer | 134/25.4 |
| 4,355,974 A | * | 10/1982 | Lee | 432/253 |
| 4,572,101 A | | 2/1986 | Lee | 118/500 |
| 4,573,851 A | * | 3/1986 | Butler | 211/41.1 |
| 4,653,636 A | * | 3/1987 | Armstrong | 118/500 X |
| 4,669,612 A | * | 6/1987 | Mortensen | 211/41.1 |
| 4,687,097 A | * | 8/1987 | Mortensen | 211/40 |
| 4,724,963 A | * | 2/1988 | Mortensen | 211/41.1 |
| 4,735,540 A | | 4/1988 | Allen et al. | 118/503 X |
| 4,736,759 A | | 4/1988 | Coberly et al. | 134/66 |
| 4,789,026 A | | 12/1988 | Shank et al. | 165/104.26 |
| 4,902,186 A | | 2/1990 | Akagawa | 118/500 |
| 4,903,168 A | | 2/1990 | Belanger, Jr. | 361/413 |
| 4,966,549 A | * | 10/1990 | Ohdate | 211/41.1 |
| 4,981,222 A | * | 1/1991 | Lee | 211/41.1 |
| 4,993,559 A | * | 2/1991 | Cota | 211/41.1 |
| 5,057,151 A | | 10/1991 | Schuster et al. | 106/2 |
| 5,232,503 A | | 8/1993 | Lewis | 118/421 |
| 5,295,777 A | | 3/1994 | Hodos | 414/217 |
| 5,403,401 A | | 4/1995 | Haafkens et al. | 118/500 X |

(List continued on next page.)

Primary Examiner—Daniel P. Stodola
Assistant Examiner—Khoa Tran
(74) Attorney, Agent, or Firm—Burns Doane Swecker & Mathis LLP

(57) ABSTRACT

A fixturing device which supports a substrate or a plurality of substrates in a vertical orientation during cleaning, drying, and coating processing steps while minimizing the contact surfaces between the fixture and each substrate so that a maximum of the substrate surface is exposed. The fixturing device utilizes converging support surfaces that terminate at the closest point in a gap with a distance less than the thickness of a substrate. The converging support surfaces counter surface tension, cohesion of the liquid molecules, and the adhesion of the liquid molecules on the surface of the fixturing device. The gap in the converging support surfaces prevents the fixturing device from retaining liquid at the interface of the substrate and the fixture. In conjunction, the contoured passages enhance the drawing of liquid away from the fixturing device and prevents pooling and staining the substrate. This fixturing device can be implemented in plurality to form two or three dimensional arrays to support a plurality of substrates. The fixturing device can be designed to interface with substrates through an internal aperture, an outer perimeter, or as an end effector on a gripper.

7 Claims, 8 Drawing Sheets

U.S. PATENT DOCUMENTS

| | | | |
|---|---|---|---|
| 5,445,172 A | 8/1995 | Thompson et al. ......... 134/153 |
| 5,455,062 A | 10/1995 | Mühlfriedal et al. ........... 427/8 |
| 5,492,229 A * | 2/1996 | Tamaka et al. ............ 211/41.1 |
| 5,503,173 A * | 4/1996 | Kudo et al. ............ 211/41.1 X |
| 5,534,074 A | 7/1996 | Koons .................... 118/500 X |
| 5,555,634 A | 9/1996 | Uchiyama et al. ............ 211/41 |
| 5,584,917 A | 12/1996 | Kijima et al. ....... 206/287.11 X |
| 5,626,918 A * | 5/1997 | Chamber et al. ........ 427/430.1 |
| 5,667,928 A * | 9/1997 | Thomas et al. ......... 427/430.1 |
| 5,668,056 A | 9/1997 | Wu et al. ............... 414/235 X |
| 5,686,144 A * | 11/1997 | Thebault et al. ......... 427/430.1 |
| 5,688,327 A * | 11/1997 | Swain et al. ................. 118/500 |
| 5,704,493 A | 1/1998 | Fujikawa et al. ............. 211/41 |
| 5,706,946 A * | 1/1998 | Kakizaki et al. ............ 206/454 |
| 5,749,469 A | 5/1998 | Williams .................... 206/710 |
| 5,756,163 A * | 5/1998 | Watanabe ................ 427/430.1 |
| 5,791,357 A * | 8/1998 | Hasegawa ............ 211/41.18 X |
| 5,843,532 A * | 12/1998 | Dodds ..................... 427/430.1 |
| 5,913,429 A * | 6/1999 | Han ........................ 211/41.18 |

\* cited by examiner

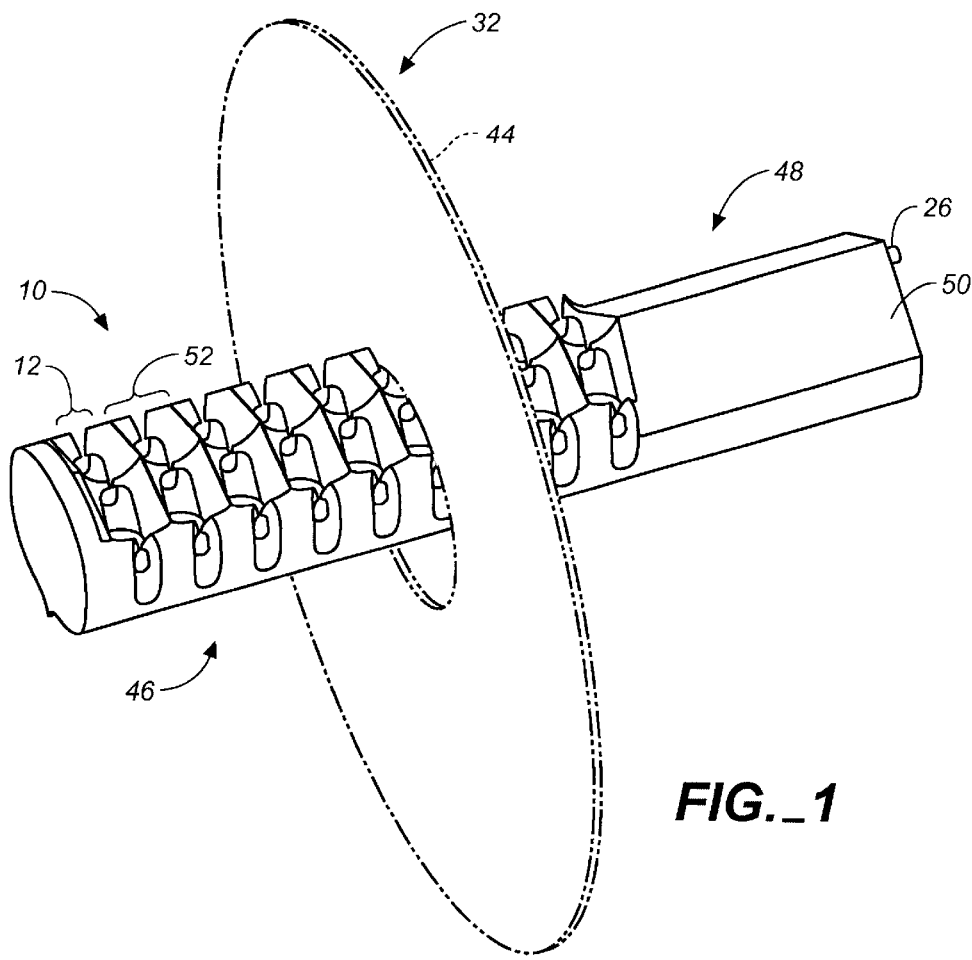
FIG._1
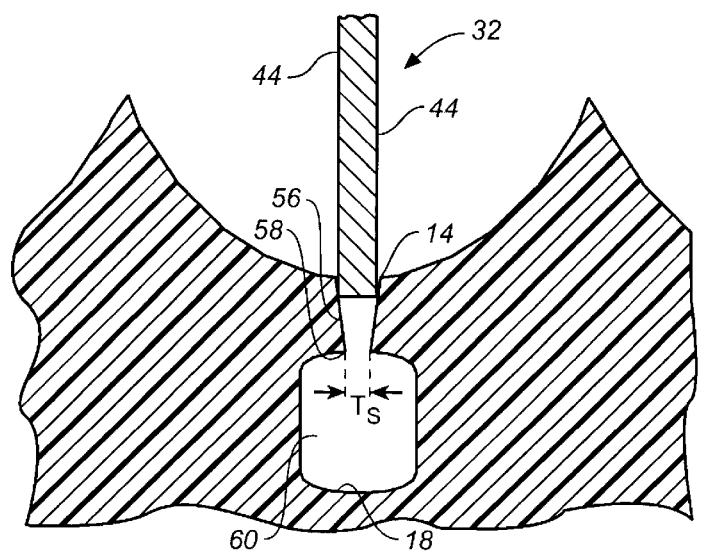
FIG._3

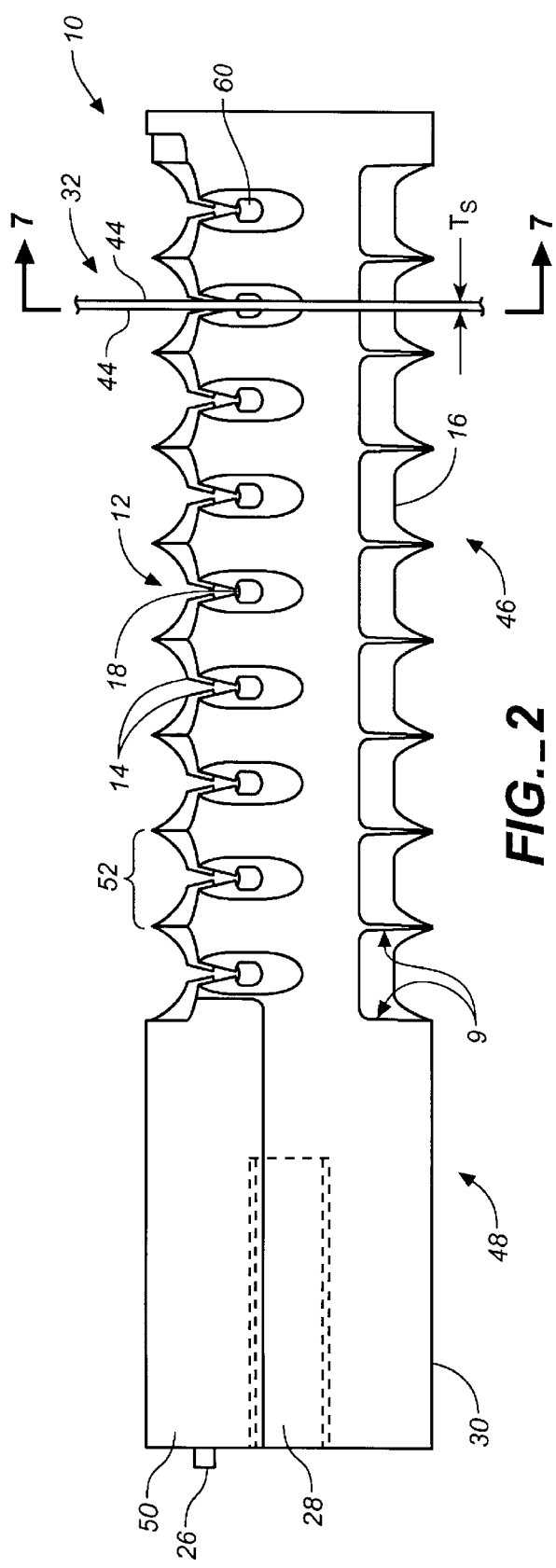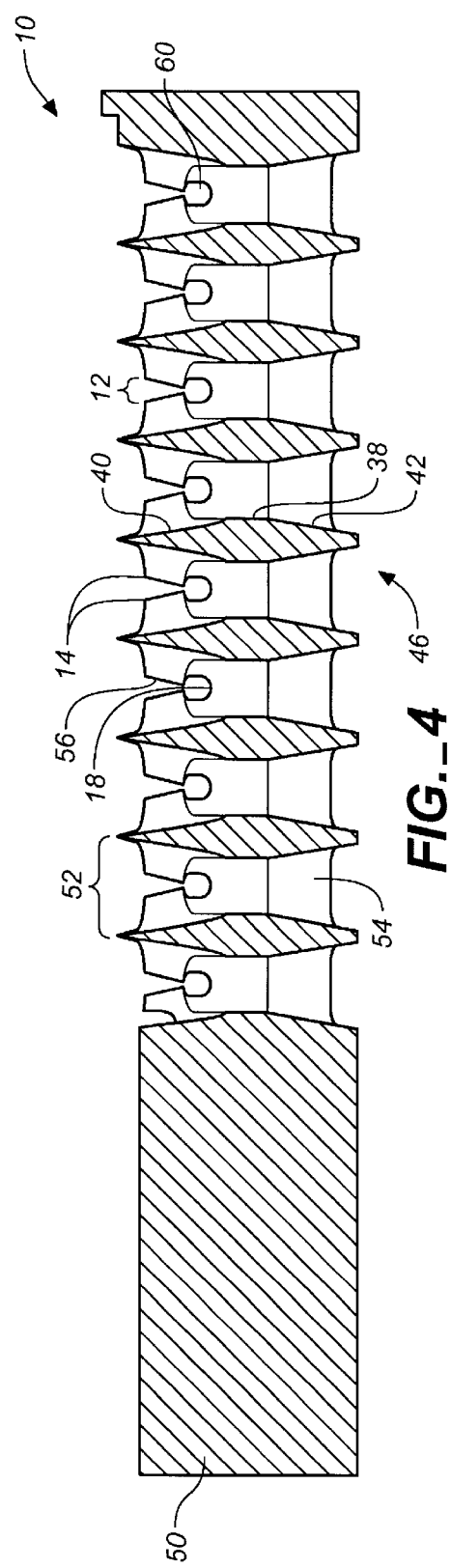

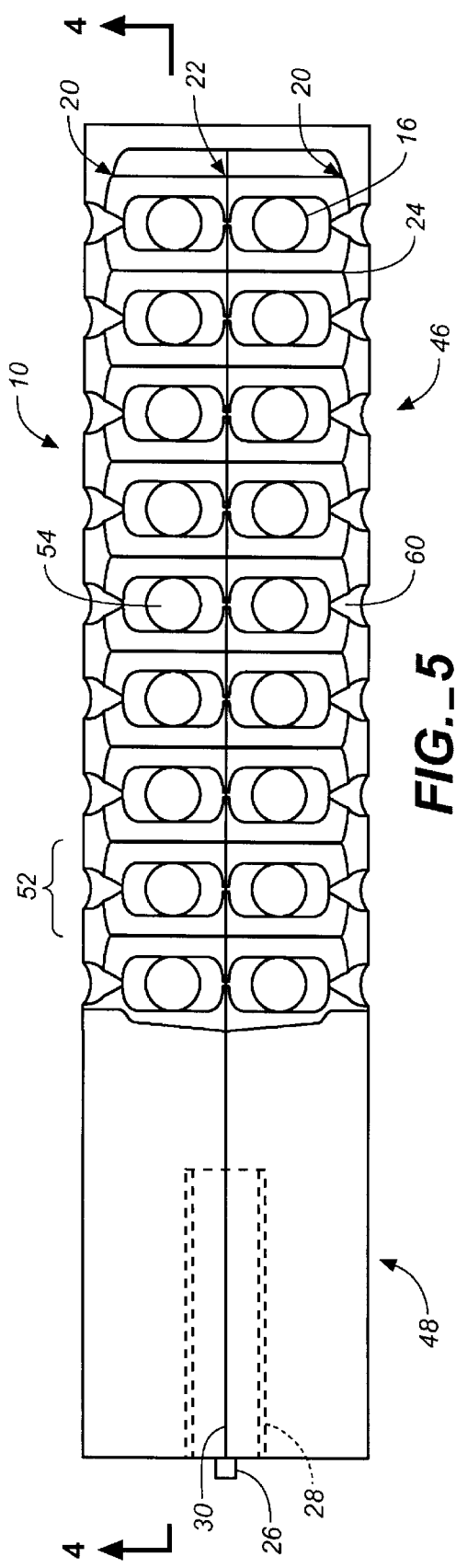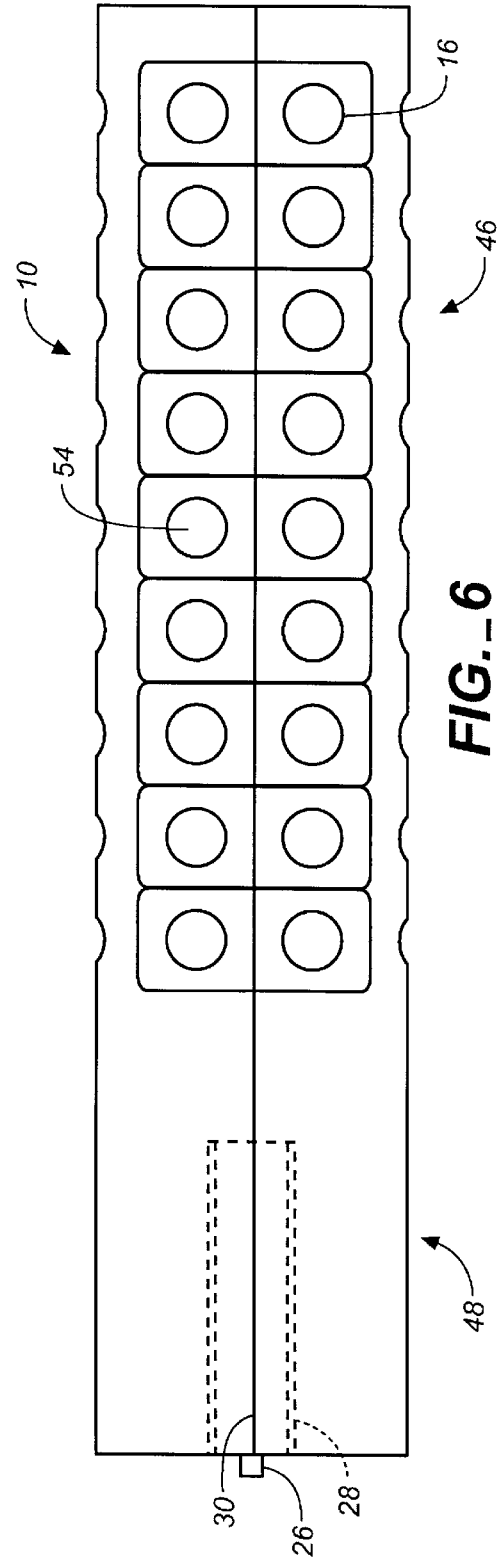

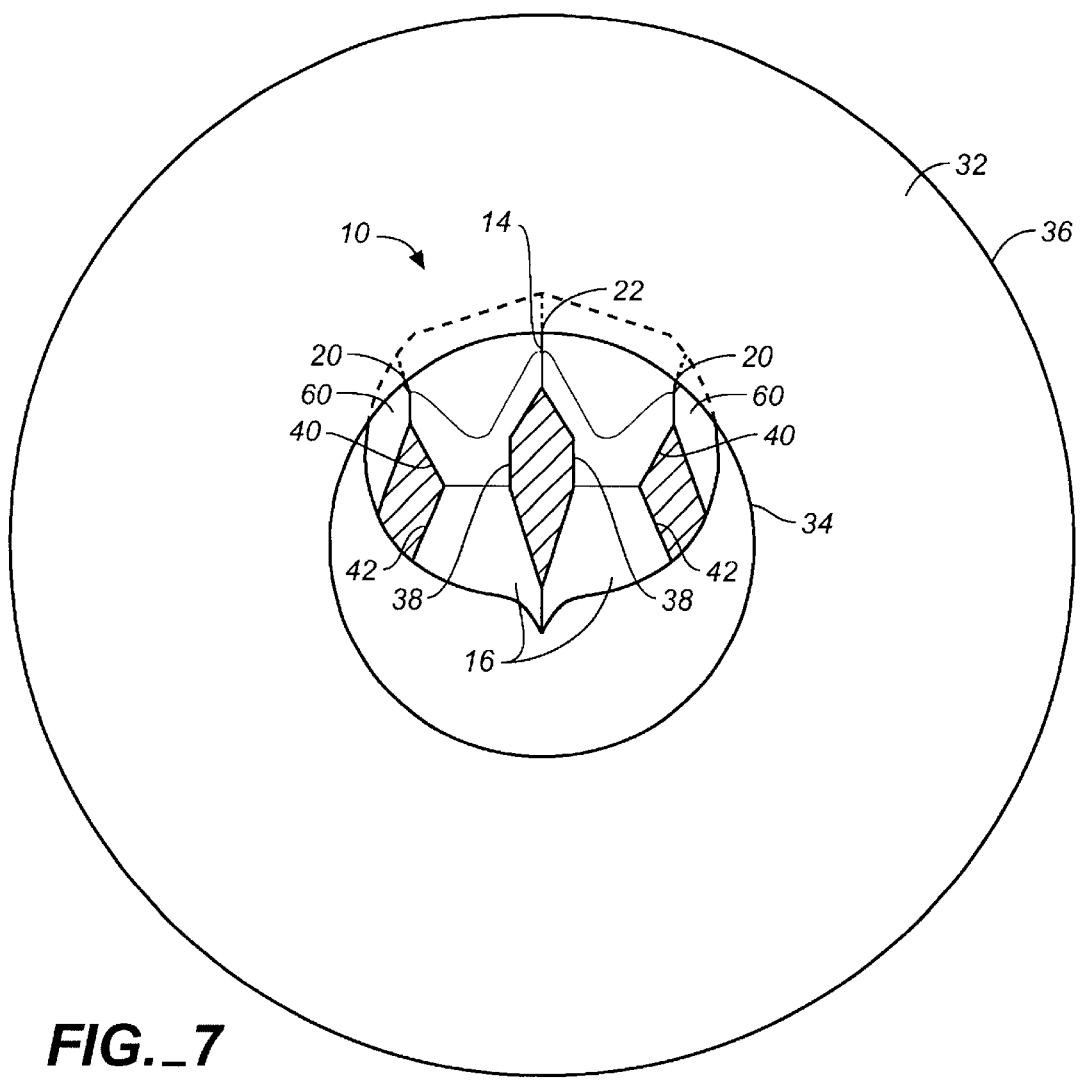
FIG._7

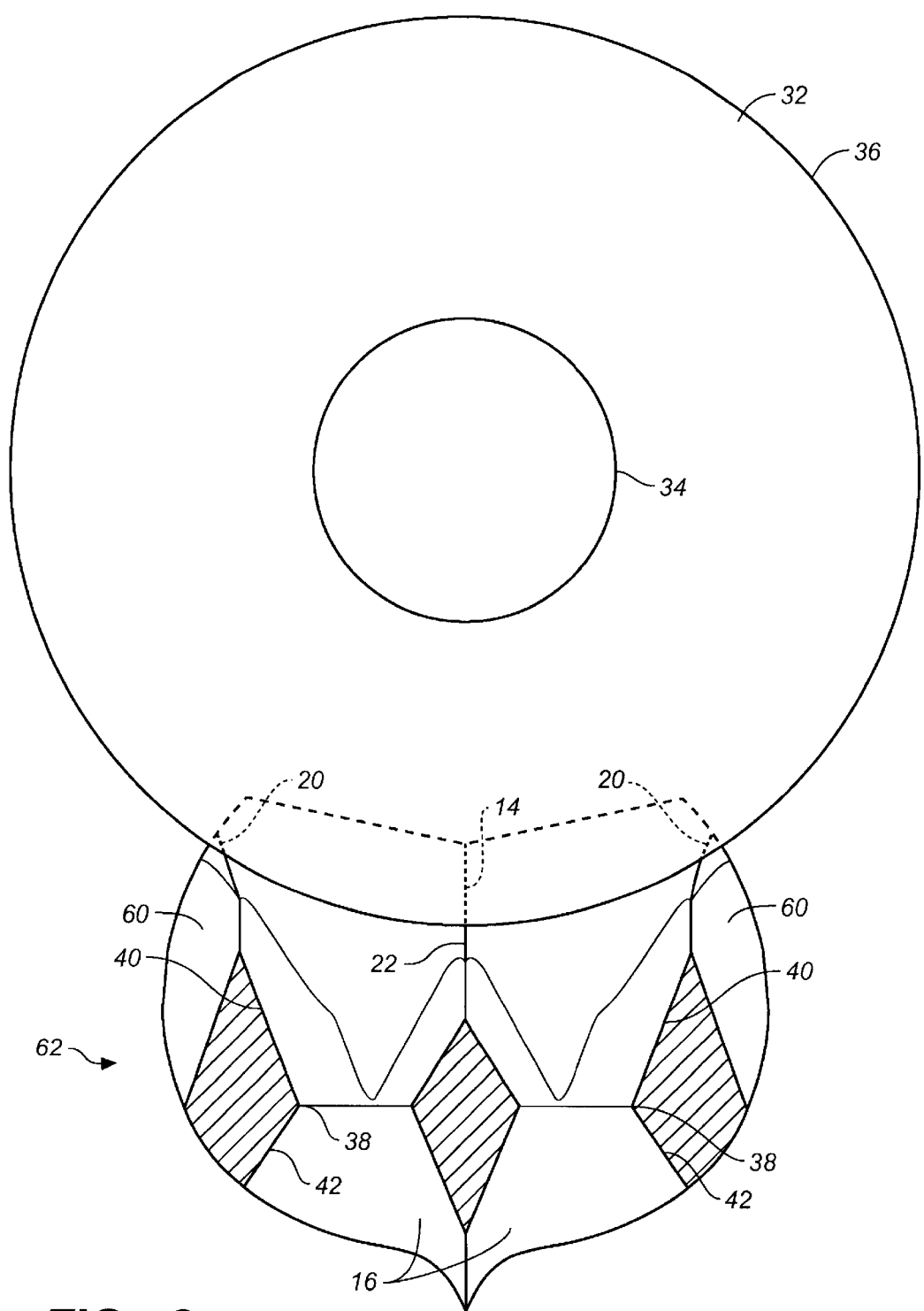
FIG._8

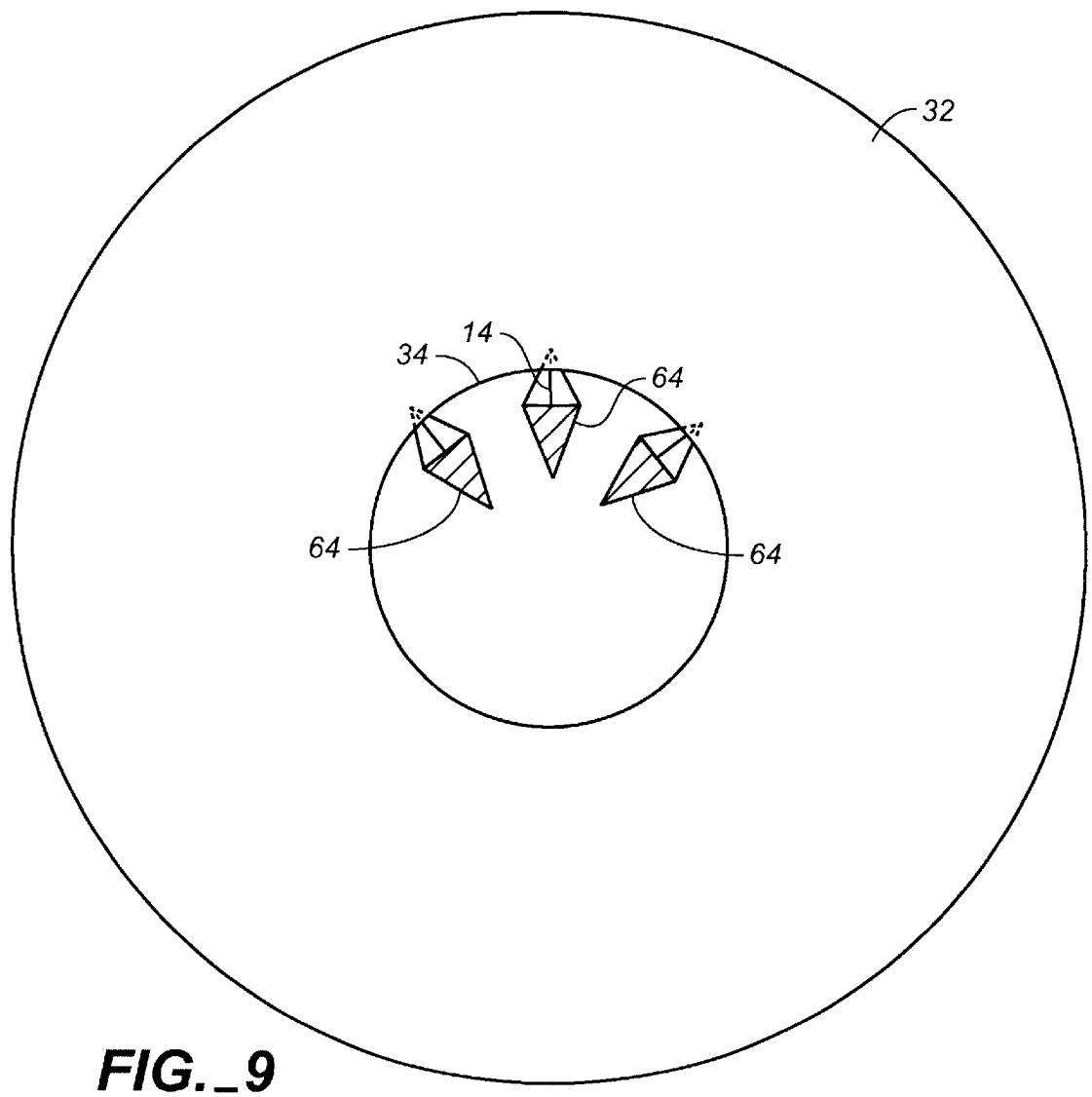
FIG._9

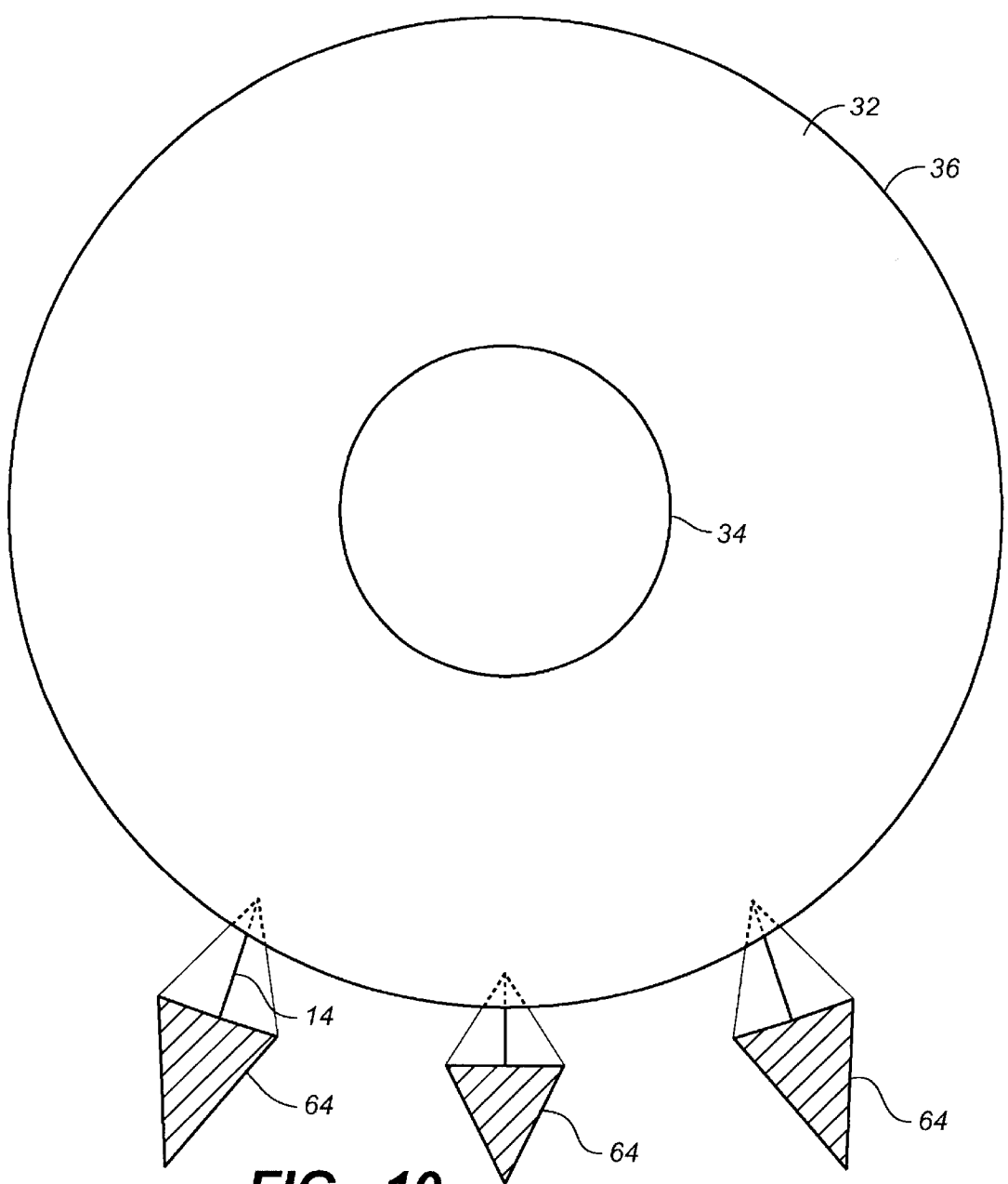
FIG._10

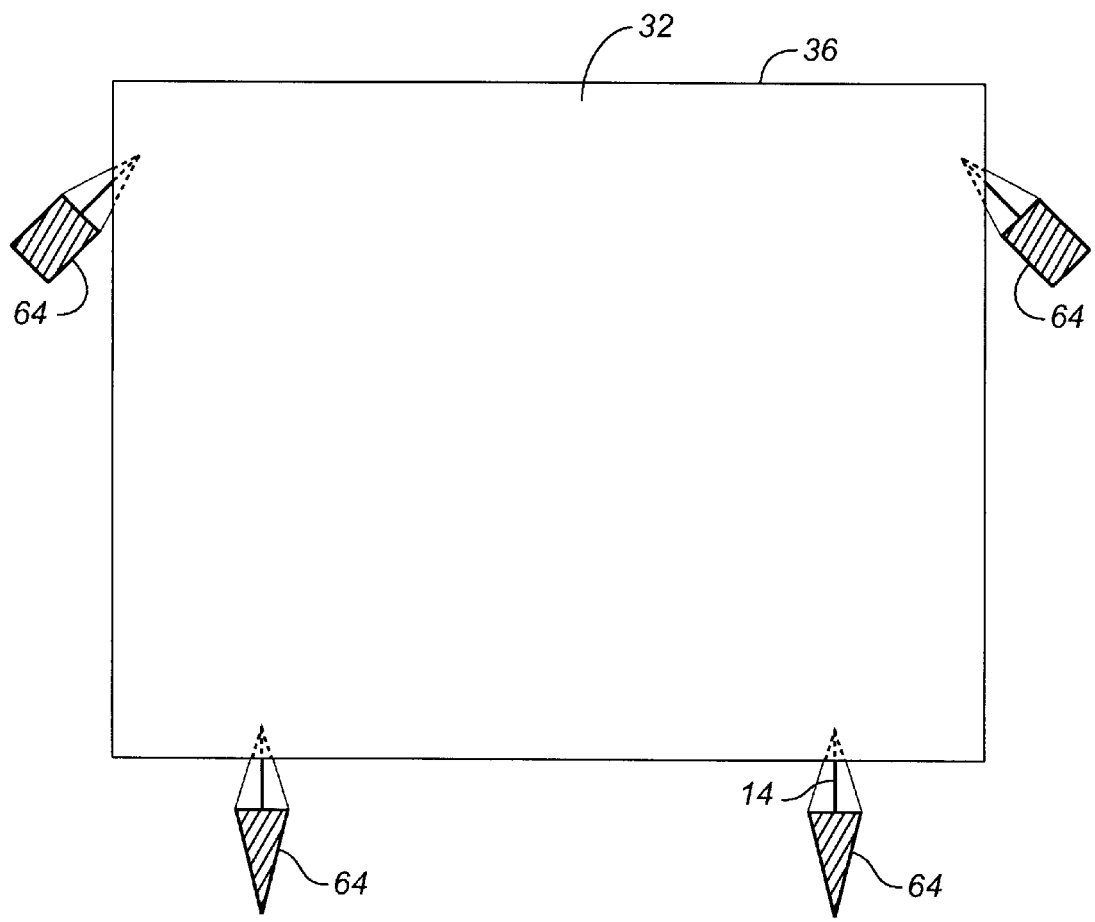
FIG._11

SUBSTRATE FIXTURING DEVICE

BACKGROUND OF THE INVENTION

1. Field of the Invention

The invention relates to a fixturing device for holding a substrate or array of substrates, and more particularly, the invention relates to a fixturing device for holding the substrates and allowing liquids to effectively drain from the substrates' surfaces.

2. Brief Description of the Related Art

A Substrates as used for manufacturing various advanced technology microelectronic devices and mass data storage components require increasingly stringent cleaning requirements. Typically, substrates are processed by using wet immersion cleaning techniques which involve a series of liquid baths whereby an operator loads the substrates into wafer carriers and dips the carriers into liquid processing bathes. After the bathing process completes, the carrier is lifted out of the bath and carried to the next process. However, liquid may adhere to the substrate surfaces or accumulate in the contact areas between the carrier and substrates which results in cross-contamination problems when the wafer carrier enters the next process. Further, contact surfaces between the carrier and substrates are not exposed during the cleaning process and thus not processed, thereby reducing the amount of substrate surface area usable for manufacturing microelectronic and data storage devices. Other critical issues in wet process cleaning are foreign particles, residue or stains, and substrate handling damage.

Known substrate fixturing devices utilize slots or notches to support the substrates, and spacing between the slots separates the substrates so that both substrate surfaces are exposed. These slots or notches may retain liquid or cleaning solution after completing a bath process, and such retained liquid or cleaning solution adhering to the fixturing device or substrate surface may contaminate a subsequent cleaning tank. Substrate fixturing devices utilized in an air or nitrogen drying process must draw liquids away from the substrate and provide a design capable of quickly drying any remaining liquid on the fixturing device, itself. Moreover, conventional wafer carriers require a plurality of substrate fixturing devices to support the substrates or wafers.

One example of a substrate holder is disclosed in U.S. Pat. No. 5,704,493 to Fujikawa, et al. This substrate holder includes a parallel arrangement of bridges affixed to a pair of frames, whereby each bridge has an alternate arrangement of teeth and valleys. The valleys between the teeth are Y-shaped or V-shaped notches in which substrates may be held, contacting only the vertical notch walls. Cylindrical vent holes formed in the bottoms of the notches provide drainage for processing liquids, or aqueous cleaning solutions, when the substrate holder is lifted out of a bathing or rinsing tank. The processing liquid present on the notches drains by gravity through the vent holes, and only a small amount of processing liquid remains in the straight portion of each vertical notch. Although the Fujikawa substrate holder allows for drainage of processing liquid, capillary action due to surface tension, cohesion of the liquid molecules, and the adhesion of the molecules on the surface of a straight cylindrical solid will prevent complete evacuation of processing liquid through the cylindrical vent holes. Moreover, the Fujikawa substrate holder assembly requires the use of at least three plates to support the parallel array of substrates.

Another example of a wafer carrier is disclosed in U.S. Pat. No. 4,993,559 to Cota. This wafer carrier includes side rails and a bottom rail with slots of sufficient width for holding the lateral edges of a wafer. Additional rails reenforce and hold the side and bottom rails in appropriate positions. The side rails have slots that are inclined at an angle with respect to the vertical such that a wafer leaning in a side slot rests substantially against a corner in the side rail slot. The bottom slots have a curved floor, convex upward, for supporting a wafer edge rather than a wafer corner, thereby substantially decreasing the probability that the wafer will become chipped when inserted or removed from the wafer carrier. While the Cota wafer carrier minimizes the contact area of the wafer edge with the rail slots, the side and bottom slots do not allow processing liquids to drain, and the slots and rails retain moisture. Like the Fujikawa substrate holder, multiple rails are required to support the wafers.

Yet another example of a wafer boat is disclosed in U.S. Pat. No. 5,534,074 to Koons. This wafer boat includes vertically extending rods mounted to a base, and each vertical rod has slots with peaked surfaces, rather than flat surfaces. The peaked surface forms an inverted V-shape and provides minimal contact between the rods and the wafers. Wafers slide into the slots and rest on the apexes of the peaked surfaces. While this arrangement may minimize wafer surface contact, it does little to accommodate for down-draft drying ventilation typically used in drying processes.

SUMMARY OF THE INVENTION

The present invention relates to a substrate fixturing device which supports an array of substrates during various processing steps, including but not limited to cleaning, drying, and coating of the substrates.

Generally speaking, the present invention provides a substrate fixturing device that supports the substrates during the various cleaning steps while draining away liquid, such as cleaning solution, retained by the fixturing device and the substrate surfaces between process steps to prevent cross-contamination of process vessels. In the present invention, by minimizing the contact surfaces between the carrier and substrates, most of the substrate surface is exposed during the cleaning process, thereby maximizing the amount of substrate surface area usable for manufacturing microelectronic and data storage devices.

In accordance with one aspect of the present invention, a substrate fixturing device utilizes peaked converging surfaces to minimally, yet firmly, contact and support the substrates in vertical notches so that a maximum surface area is exposed during cleaning processes or during air or nitrogen drying processes. The peaked converging surfaces support the substrate and enhance the drawing of liquid through passages away from the fixturing device and the substrate surfaces by gravity or by forced air or nitrogen during the drying process, thereby preventing the substrate supporting slots and fixturing device from retaining moisture. In conjunction, the passages allow the processing liquid to evacuate the fixturing device and prevents the liquids from pooling and staining the substrate at the bottom of the notches. The passages have a converging-diverging contour that, like the peaked converging surfaces, enhance the drawing of liquid away from the fixturing device and the substrate surfaces by gravity and forced air, as well as counters capillary action due to surface tension, cohesion of the liquid molecules, and the adhesion of the molecules on the surface of the fixturing device.

The present invention provides advantages of supporting substrates using a singular piece substrate fixturing device while minimizing the contact surfaces between the fixturing device and the substrates so that most of the substrate surface is exposed during the cleaning, drying, or coating processes. The passages and the pair of peaked converging supporting surfaces in the substrate supporting slots assist in the drawing away and drying of moisture present on the fixturing device.

In particular, the present invention provides a fixturing device which supports a substrate or a plurality of substrates in a vertical orientation during cleaning, drying, and coating processing steps while minimizing the contact surfaces between the fixture and each substrate so that a maximum of the substrate surface is exposed. The fixturing device utilizes converging support surfaces that terminate at the closest point in a gap with a distance less than the thickness of a substrate. The converging support surfaces counter surface tension, cohesion of the liquid molecules, and the adhesion of the liquid molecules on the surface of the fixturing device. The gap in the converging support surfaces prevents the fixturing device from retaining liquid at the interface of the substrate and the fixture. In conjunction, the contoured passages enhance the drawing of liquid away from the fixturing device and prevents pooling and staining the substrate. This fixturing device can be implemented in plurality to form two or three dimensional arrays to support a plurality of substrates. The fixturing device can be designed to interface with substrates through an internal aperture, an outer perimeter, or as an end effector on a gripper.

BRIEF DESCRIPTION OF THE DRAWINGS

The present invention will now be described in greater detail with reference to the preferred embodiments illustrated in the accompanying drawings, in which like elements bear like reference numerals, and wherein:

FIG. 1 is a perspective view of a fixturing device in accordance with the present invention with a substrate supported at an inner edge by a substrate support slot;

FIG. 2 is a side view of the embodiment of FIG. 1;

FIG. 3 is a partial enlarged side view of FIG. 2;

FIG. 4 is a cross-sectional view taken along line 4—4 of the fixturing device, as shown in FIG. 5, having a plurality of substrate support slots with passages having a converging-diverging contour;

FIG. 5 is a top view of the fixturing device showing passages tapering toward the axis of the passage;

FIG. 6 is a bottom view of the fixturing device showing passages that flare away from the axis of the passage;

FIG. 7 is a cross-sectional view taken along line 7—7 of the embodiment of FIG. 2;

FIG. 8 is a cross-sectional view of a second embodiment of the fixturing device supporting a substrate at an outer edge;

FIG. 9 is a cross-sectional view of a third embodiment of the fixturing device supporting a substrate at an inner edge by three pairs of peaked converging support surfaces;

FIG. 10 is a cross-sectional view of a the embodiment of FIG. 9 supporting a substrate at an outer edge by three pairs of peaked converging support surfaces; and FIG. 11 is a cross-sectional view of the embodiment of FIG. 9 supporting a substrate at an outer edge by four pairs of peaked converging support surfaces.

DETAILED DESCRIPTION OF THE PREFERRED EMBODIMENTS

As shown in the drawings, the fixturing device 10 includes a plurality of substrate support slots 52. Each support slot 52 has at least one passage 16 (two passages are shown in FIGS. 5–6), whereby the passage has a first portion 40 which tapers from a large cross-sectional area to a straight central portion 38, having a smaller cross-sectional area, and then tapers out to a second portion 42 having a larger cross-sectional area. This converging-diverging contour is best illustrated in FIGS. 4 and 7. The expanding opening of the second portion 42 provides superior drainage over the straight cylindrical opening of the prior art since this design counters the surface tension, cohesion of the liquid molecules, and the adhesion of the liquid molecules clinging to the passage walls 20, 22, 24 and draws the liquid away from the fixturing device 10.

In practice, the fixturing device 10 is fabricated from a non-wettable or hydrophobic material, or the device has a surface coating of a non-wettable or hydrophobic material to further prevent the retention of aqueous solutions that may adhere to the fixturing device surface 44. This fixturing device 10 can be used for many processes including, but not limited to cleaning, rinsing, drying, and coating.

FIG. 1 shows a fixturing device 10 having a slotted portion 46, a mounting portion 48, and an alignment pin 26 in the mounting portion and extending beyond said mounting portion 48. The mounting portion 48 may have a chamfer 50 to help draw away liquids adhering to the fixturing device 10 during a drying processes.

In the first embodiment as shown in FIGS. 1–3, a substrate 32 is supported by a vertical notch 12 having a pair of converging support surfaces 14 such that the substrate minimally contacts the fixturing device 10, and thus a maximum active surface area 44 of the substrate is exposed. Any processing liquid in the areas of contact between the substrate 32 and the converging support surface 14 evacuates through the tapered passages 16 so that cross-contamination of the substrates, due to the transferring of processing liquids, is prevented. Additionally, the converging support surfaces 14 are beveled on both sides to form a peak and further draws liquid away from the substrate 32. The fixturing device 10 can be affixed to an end bracket (not shown) using an axially threaded bore 28; however, the substrate support is provided by the fixturing device 10.

As shown in FIGS. 4–6, the slotted portion 46 has a series of through holes 54 arranged in two columns with the through holes having axes perpendicular to the axially threaded bore 28 to form a series of parallel vertical passages 16. At least two first passage walls 20 separate the vertical passages 16 from an outer portion of the fixturing device 10. A second passage wall 22 separates the columns of parallel vertical passages 16. A third passage wall 24 is perpendicular to both the first passage walls 20 and the second passage wall 22. Vertical notches 12 have a top portion 56 and a bottom portion 18, and the notches formed in the first and second passage walls 20, 22 provide substrate support slots 52 that can receive a substrate 32. The vertical notches 12 of the first passage walls 20 and the second passage wall 22 are aligned so that the substrates 32 are firmly supported in the top portion 56. As shown most clearly in FIG. 3, the top portion 56 has a pair of converging support surfaces 14 that terminates at the closest point in a gap 58 with a distance less than the thickness of a substrate $T_s$. The gap 58 extends along the entire converging support surface 14. The bottom portion 18 below the gap 58 forms a through hole to create a side passage 60. The vertical and side passages 16, 60 may have various shapes including, but not limited to circular, square, slotted, or hexagonal.

In a different configuration, the slotted portion 46 has a series of through holes 54 arranged in a single column with the through holes having axes perpendicular to the axially threaded bore 28 to form a series of vertical passages 16. Two first passages walls 20 ant separate the vertical passages 16 from an outer portion of the fixturing device 10. A third passage wall 24 is perpendicular to the first passage walls 20. In this configuration, only two pairs of converging support surfaces 14 contact and support the substrate 32.

As shown in FIG. 7, the singular piece fixturing device 10 of appropriate diameter may fit within an inner opening of a doughnut-shaped substrate 32. The fixturing device 10 supports the substrate 32 on an inner substrate edge 34. The second passage wall 22 is aligned higher with respect to the first passage walls 20 such that the substrate support slot 52 forms a curved surface, convex upward, so that the converging support surfaces 14 firmly support the inner substrate edge 34 but contacts the inner substrate edge only minimally.

In a second embodiment of the present invention (shown in FIG. 8), the singular piece fixturing device 62 supports an outer substrate edge 36, whereby the second passage wall 22 is aligned lower with respect to the first passage walls 20 such that the substrate support slot 52 forms a curved surface, concave upward. In this configuration, the converging support surfaces 14 firmly support the outer substrate edge 36 while contacting the outer substrate edge only minimally. Thus, fixturing device 62 can be adapted to support a substrate 32 that is solid or doughnut-shaped with an inner opening.

In a third embodiment of the present invention (shown in FIGS. 9–11), the fixturing device 64 has a plurality of substrate support slots 52 that form a single wall. In this configuration, the fixturing device 64 has only one pair of converging support surfaces 14 which contact and support the substrate 32. A plurality of fixturing devices 64 (FIG. 9 shows three devices) can be arranged to support a substrate 32 on an inner substrate edge 34 or an outer substrate edge 36 (FIGS. 10–11 show three and four devices) of any shape.

Any processing liquid in contact between the substrates 32 and the converging support surfaces 14 evacuates through the side passages 60 formed below the gap 58. The fixturing device 64 can be designed to interface with substrates 32 as an end effector on a gripper (not shown).

While the invention has been described in detail with reference to the preferred embodiments thereof, it will be apparent to one skilled in the art that various changes and modifications can be made and equivalents employed, without departing from the present invention.

What is claimed is:

1. A combination of a substrate and a substrate holder, the substrate holder comprising:

a mandrel having a slotted portion and a mounting portion; and a plurality of substrate support slots perpendicular to an axis extending longitudinally along a length of said mandrel, each of the substrate support slots formed by a pair of converging support surfaces that terminate at support surface edges, and a gap formed between the support surface edges, the gap extending along the entire support surface and having a distance between the support surface edges which is less than a thickness of the substrate to be supported; and a passage in each of the support slots below said gap, said passage configured to draw fluid away from the substrate when the substrate is supported in the support slot.

2. The combination according to claim 1, wherein each of said converging surfaces is peaked along the entire support surface.

3. The combination according to claim 1, wherein said mandrel has an axially threaded bore in said mounting portion.

4. The combination according to claim 1, wherein said mandrel includes an alignment pin having a pin axis mounted parallel to a longitudinal axis of said mandrel and extending beyond said mounting portion.

5. The substrate holder according to claim 1, wherein said passage in each of said substrate support slots is below said gap and along each side of said substrate support slots.

6. The combination of claim 1, wherein the passage has a converging-diverging contour which counters surface tension and draws liquid away from the substrate.

7. The combination of claim 1, wherein the passage extends substantially perpendicular to the longitudinal axis of the mandrel and has a cross section parallel to the longitudinal axis which varies along a length of the passage.

* * * * *